United States Patent
Heiries et al.

(10) Patent No.: US 10,838,010 B2
(45) Date of Patent: Nov. 17, 2020

(54) AUTOMATIC METHOD FOR ESTIMATING THE CAPACITANCE OF A CELL OF A BATTERY

(71) Applicant: Renault S.A.S., Boulogne-Billancourt (FR)

(72) Inventors: Vincent Heiries, Saint-Jean-de-Moirans (FR); Paul-Henri Michel, Grenoble (FR)

(73) Assignee: Renault S.A.S., Boulogne-Billancourt (FR)

( * ) Notice: Subject to any disclaimer, the term of this patent is extended or adjusted under 35 U.S.C. 154(b) by 463 days.

(21) Appl. No.: 15/531,052

(22) PCT Filed: Nov. 26, 2015

(86) PCT No.: PCT/FR2015/053244
§ 371 (c)(1),
(2) Date: May 26, 2017

(87) PCT Pub. No.: WO2016/083758
PCT Pub. Date: Jun. 2, 2016

(65) Prior Publication Data
US 2018/0313904 A1    Nov. 1, 2018

(30) Foreign Application Priority Data
Nov. 28, 2014 (FR) .................................... 14 61620

(51) Int. Cl.
*G01R 31/367* (2019.01)
*G01R 31/389* (2019.01)
(Continued)

(52) U.S. Cl.
CPC ......... *G01R 31/367* (2019.01); *G01R 31/389* (2019.01); *G01R 31/396* (2019.01);
(Continued)

(58) Field of Classification Search
None
See application file for complete search history.

(56) References Cited

U.S. PATENT DOCUMENTS 5,606,243 A * 2/1997 Sakai ................. G01R 31/3648
320/134
2006/0111854 A1   5/2006 Plett
(Continued)

FOREIGN PATENT DOCUMENTS

FR    2968769    6/2012
FR    2975188    11/2012
(Continued)

OTHER PUBLICATIONS

Andre et al., "Advanced mathematical methods of SOC and SOH estimation for lithium-ion batteries" Journal of Power Sources 224 (2013) 20-27 (Year: 2013).*
(Continued)

*Primary Examiner* — John C Kuan
(74) *Attorney, Agent, or Firm* — Occhiuti & Rohlicek LLP (57) ABSTRACT

Estimating cell capacitance includes learning a function that returns capacitance as a function of an earlier capacitance and a physical characteristic that is correlated with changes in that capacitance and using a supervised learning algorithm on a learning database that has values of the capacitance, values of that physical characteristic measured concurrently with the capacitance and a preceding value of the capacitance.

16 Claims, 3 Drawing Sheets

LEGEND
60 = first estimator
66 = second estimator
68 = third estimator
70 = supervised learning-machine (51) Int. Cl.
G01R 31/396 (2019.01)
G01R 31/382 (2019.01)
G01R 31/392 (2019.01)
G01R 31/387 (2019.01)
G01R 31/3842 (2019.01)

(52) U.S. Cl.
CPC .......... *G01R 31/382* (2019.01); *G01R 31/387* (2019.01); *G01R 31/3842* (2019.01); *G01R 31/392* (2019.01)

(56) References Cited

U.S. PATENT DOCUMENTS

| | | | | |
|---|---|---|---|---|
| 2011/0161025 | A1* | 6/2011 | Tomura | H01M 10/48 |
| | | | | 702/63 |
| 2014/0009123 | A1 | 1/2014 | Park et al. | |
| 2014/0058595 | A1 | 2/2014 | Li et al. | |
| 2015/0088443 | A1* | 3/2015 | Lorin | G01R 31/3648 |
| | | | | 702/63 |
| 2016/0049821 | A1* | 2/2016 | Aridome | H02J 7/0073 |
| | | | | 320/128 |
| 2016/0139210 | A1* | 5/2016 | Coenen | B60L 58/16 |
| | | | | 702/63 |

FOREIGN PATENT DOCUMENTS

| | | |
|---|---|---|
| WO | WO 2006/057468 | 6/2006 |
| WO | WO 2009/158225 | 12/2009 |

OTHER PUBLICATIONS

Du et al., "State of charge estimation for Li-ion battery based on model from Extreme learning machine" Control Engineering Practice 26 (2014) 11-19 (Year: 2014).*

Hansen et al., "Support vector based battery state of charge estimator" Journal of Power Sources 141 (2005) 351-358 (Year: 2005).*

Hu et al., "A multiscale framework with extended Kalman filter for lithium-ion battery SOC and capacity estimation" Applied Energy 92 (2012) 694704 (Year: 2012).*

Shi et al., "Estimation of Battery State-Of-Charge Using v-Support Vector Regression Algorithm" International Journal of Automotive Technology, vol. 9, No. 6, pp. 759-764 (2008) (Year: 2008).*

Xiong et al., "A data-driven multi-scale extended Kalman filtering based parameter and state estimation approach of lithium-ion polymer battery in electric vehicles" Applied Energy 113 (2014) 463476 (Year: 2014).*

Plett, Gregory L., "Extended Kalman Filtering for Battery Management Systems of LiPB-based HEV Battery Packs Part 3. State and Parameter Estimation" Journal of Power Sources, 134:277-292 (2004).

Cherkassky, Vladimir and Yunqian Ma, "Practical Selection of SVM Parameters and Noise Estimation for SVM Regression" Neural Networks, 17:113-126 (2004).

Julier, Simon J. and Jeffrey K. Uhlmann, "A New Extension of the Kalman Filter to Nonlinear Systems," Proc. SPIE 3068, Event: AexoSense '97, 1997.

Plett, Gregory L., "Extended Kalman Filtering for Battery Management Systems of LiPB-based HEV Battery Packs Part 1. Background" Journal of Power Sources, 134:252-261 (2004).

Plett, Gregory L., "Extended Kalman Filtering for Battery Management Systems of LiPB-based HEV Battery Packs Part 2. Modeling and Identification" Journal of Power Sources, 134: 262-276 (2004).

Plett, Gregory L., "Sigma-Point Kalman Filtering for Battery Management Systems of LiPB-based HEV Battery Packs, Part 1: Introduction and State Estimation", Journal of Power Sources, 161: 1356-1368 (2006).

Plett, Gregory L., "Sigma-Point Kalman Filtering for Battery Management Systems of LiPB-based HEV Battery Packs, Part 2: Simultaneous State and Parameter Estimation", Journal of Power Sources, 161: 1369-1384 (2006).

Plett, Gregory L., "Recursive Approximate Weighted Total Least Squares Estimation of Battery Cell Total Capacity", Journal of Power Sources, 196: 2319-2331 (2011).

* cited by examiner $$SOC_{k+1} = SOC_k + \frac{i_k * T_e}{C_{n,k3}} + w_k$$

Fig. 4

$$y_k = OCV(SOC_k) - h_{i,k2} * X_k + v_k$$

Fig. 5

$$C_{n,k3+1} = G_{svm}(C_{n,k3}; E_c) + w_{3,k3}$$

Fig. 6

$$\hat{z}_{k3} = \frac{(SOC_k - SOC_{k-N})}{NT_e} \cdot 3600 \cdot C_{n,k3} + v_{3,k3}$$

$$\begin{bmatrix} SOC_{k+1} \\ V_{Diff,k+1} \end{bmatrix} = \begin{bmatrix} 1 & 0 \\ 0 & 1 - \frac{T_a}{R_D \cdot C_D} \end{bmatrix} \cdot \begin{bmatrix} SOC_k \\ V_{Diff,k} \end{bmatrix} + \begin{bmatrix} -\frac{T_a}{C_n^{ini}} \\ \frac{T_a}{C_D} \end{bmatrix} \cdot i_k + w_k \quad \leftarrow 116$$

Fig. 9

$$y_k = OCV(SOC_k) - V_{Diff,k} - RO^{ini} \cdot i_k + v_k \quad \leftarrow 118$$

Fig. 10

AUTOMATIC METHOD FOR ESTIMATING THE CAPACITANCE OF A CELL OF A BATTERY

RELATED APPLICATIONS

This is the national stage of international application PCT/FR2015/053244, filed on Nov. 26, 2015, which claims the benefit of the Nov. 28, 2014 priority date of French application FR 1461620, the contents of which are herein incorporated by reference.

FIELD OF INVENTION

The invention concerns battery management, and in particular, estimating capacity of a battery's cell.

BACKGROUND

Known methods for estimating a battery cell's capacity involve measuring, at a time k, a charging or discharging current $i_k$ of the cell and using a Kalman filter to estimate the cell's capacity $C_{n,k3}$ at a time k3. The estimation procedure includes calculating a prediction for the capacity $C_{n,k3}$ with the help of a state model that relates the capacity $C_{n,k3}$ to the capacity $C_{n,k3-1}$ of this same cell at a previous time k3−1, and acquiring, at time k3, a measurable physical quantity $z_{k3}$ defined by the following summation:

$$z_{k3} = \sum_{m=k-N}^{m=k-1} i_m$$

where k is the time closest to the time k3 and N is an integer greater than or equal to one, $z_{k3}$ being equal to $i_{k-1}$ when N is equal to one, calculating a prediction $\hat{z}_{k3}$ of the measurable physical quantity $z_{k3}$ with the help of an observation model, and correcting the prediction of the capacity $C_{n,k3}$ as a function of a difference between the acquired physical quantity $z_{k3}$ and the prediction $\hat{z}_{k3}$ calculated from the observation model.

Such a method is described in particular in chapter 4.2.2 of part 3 of L. Plett, et al.: "Extended Kalman filtering for battery management systems of LiPB-based HEV battery packs," journal of Power Sources, 2004, page 252-292. Hereinafter, this article shall be denoted as the abbreviation "Plett 2004."

SUMMARY

The invention uses the ability to learn a capacity function $G_{SVM}$ from a learning database to obtain a more accurate state model for estimating the capacity.

Among the advantages are that specifying the learning of a function in the form $G_{SVM}(C_{n,k3}, cc_{1,k3}) = C_{n,k3} + f_{SVM}(cc_{1,k3})$ makes it possible to obtain a linear state model. This improves the estimate of capacity by avoiding the introduction of error that might otherwise result from linearizing the state model about the capacity $C_{n,k3}$.

Another advantage is that triggering the execution of the supervised learning algorithm on a database containing the capacities previously estimated by the Kalman filter makes it possible to update the state model and thus automatically adapt the model to the changes that may have occurred in the cell.

Yet another advantage is that triggering a new execution of the supervised learning algorithm in response to the crossing of a threshold predetermined by a covariance of an error in the estimate of the capacity makes it possible to limit the computational load required to execute the method without significantly impairing the estimate of the capacity. In fact, in this case, the supervised learning algorithm is executed only when such execution is necessary.

In the method claimed, the observation model for calculating the prediction $\hat{z}_{k3}$ is a linear function of the capacity $C_{n,k3}$. This avoids burdening the calculation of the prediction $\hat{z}_{k3}$ with errors related to the linearization of the observation model about the value $C_{n,k3}$. This represents an improvement over the observation model described in chapter 4.2.2 of Plett 2004, which is nonlinear and thus must necessarily be linearized about the capacity $C_{n,k3}$. Such a linearization necessarily results in errors when estimating the corrected capacity $C_{n,k3}$. Moreover, the need to linearize the observation model imposes a significant computational load.

The estimation of the coefficients of an infinite impulse response filter and the use of this filter in a state model that is then used to estimate capacity also promotes improved prediction of a cell's state-of-charge.

In another aspect, the invention concerns a tangible and non-transitory data-recording medium containing instructions to execute any one of the above automatic estimation methods when these instructions are executed by an electronic computer.

In yet another aspect, the invention concerns a battery-management system configured to manage a battery having at least one cell, and an electronic computer programmed to carry out the claimed estimation method.

In yet another aspect, the invention concerns an automobile containing the claimed battery-management system.

BRIEF DESCRIPTION OF THE DRAWINGS

The invention will be better understood upon perusal of the following description, given solely as a nonlimiting example and making reference to the drawings, in which.

In these figures, the same references are used to denote the same elements. In the remainder of this description, characteristics and functions well known to the person skilled in the art are not described in detail.

As used herein, "computational load" refers to the number of operations to be performed by an electronic computer. Thus, decreasing the computing load means decreasing the number of operations to be performed in order to achieve the same result or a result of the same kind.

DETAILED DESCRIPTION

Figure 1:
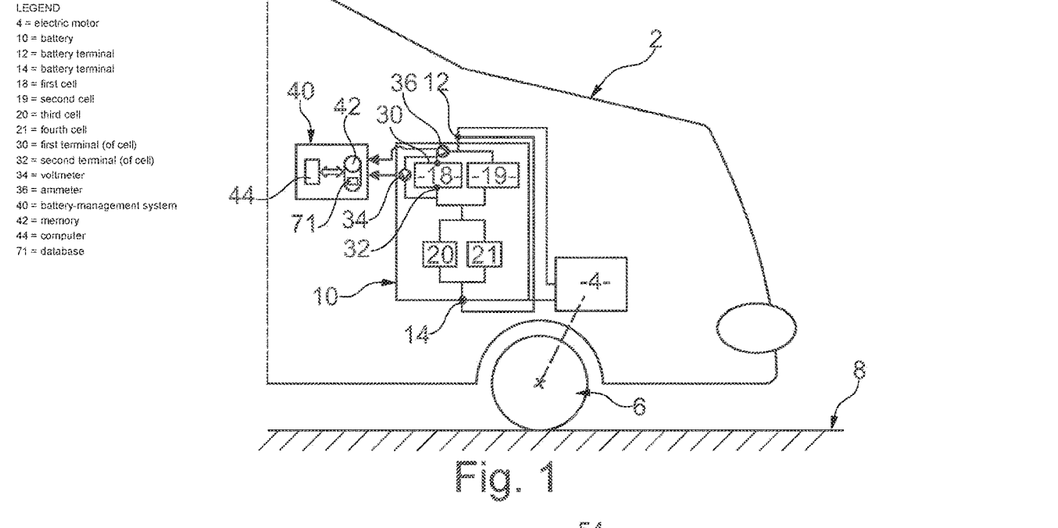
FIG. 1 is a partial schematic illustration of an automobile outfitted with an electrical battery.

FIG. 1 shows an electric vehicle 2 having an electric motor 4 that rotates wheels 6 to move the vehicle 2 along a roadway 8. A battery 10 provides electrical energy to the motor 4.

The battery 10 has first and second terminals 12, 14 for electrical connection and battery cells 18-21 electrically connected between the terminals 12, 14. The terminals 12, 14 are connected to the electrical loads to be energized. In the illustrated embodiment, the terminals 12, 14 connect to the electric motor 4. To simplify the figure, only four battery cells are shown.

Typically, the battery cells are grouped into several stages. These stages are connected in series between the terminals 12, 14. FIG. 1 shows only two stages: a first stage that comprises first and second cells 18, 19 and a second stage that comprises the third and fourth cells 20, 21. Each stage comprises several branches connected in parallel. Each branch of a stage comprises one electric cell or several electric cells in series. In FIG. 1, the first stage comprises two branches, each branch having a single electric cell. The second stage is structurally identical to the first stage. All battery cells 10 are structurally identical except for manufacturing tolerances. Consequently, only the first cell 18 shall now be described in further detail. Hence, the ordinal "first" can be omitted.

As shown in FIG. 1, the cell 18 comprises first and second terminals 30, 32 that electrically connect it to the other cells, and ultimately, to the battery's terminals 12, 14. The cell 18 is also mechanically fixed, with no degrees of freedom, to the other cells of the battery 10 in order to form a pack of cells. A suitable type of cell is that used in a lithium-ion polymer battery.

The cell 18 stores electrical energy. This stored electrical energy powers the motor 4, which discharges the cell 18. Alternatively, the cell 18 can receive electrical energy, which charges the cell. The complete discharging of a cell followed by its complete recharging define a charging cycle.

The cell 18 is characterized by a nominal initial capacity $C_n^{ini}$, an initial internal resistance $RO^{ini}$, a maximum current flow $I_{max}$, a maximum voltage $U_{max}$, a minimum voltage $U_{min}$, and a function $OCV(SOC_k)$. The nominal initial capacity $C_n^{ini}$ is the initial capacity of the cell 18, before it begins to age. A battery cell's capacity defines the maximum quantity of electrical energy that can be stored in that cell. As the cell 18 ages, that is, as the number of charging and discharging cycles increases, the capacity of the cell decreases. At time k, the nominal capacity of the cell 18 shall be denoted as $C_{n,k}$.

The initial internal resistance $RO^{ini}$ is the value of the internal resistance of the cell 18 before it begins to age. The internal resistance of a cell is a physical quantity that is found in most circuit models of a battery cell. As the cell ages, the internal resistance usually increases. At time k, the internal resistance of the cell 18 shall be denoted $RO_k$.

A battery cell may sustain damage if the voltage across its terminals falls outside of an allowable range or if is called on to deliver too much current. In particular, $I_{max}$ is the maximum current that can be delivered by the cell 18 without it becoming damaged, $U_{max}$ is the maximum voltage that may be present constantly between the first and second terminals 30, 32 of the cell without damaging it, and $U_{min}$ is the minimum voltage between the first and second terminals 30, 32 when the cell 18 is completely discharged.

$OCV(SOC_k)$ is a predetermined function that returns the no-load voltage of the cell 18 as a function of its state-of-charge $SOC_k$. The no-load voltage is the voltage measurable between the first and second terminals 30, 32 after the cell 18 has been electrically insulated from any electrical load for two hours.

The cell's state-of-charge at time k is denoted $SOC_k$. It is equal to 100% when the quantity of electrical energy stored in the cell 18 is equal to its capacity $C_{n,k}$. It is equal to 0% when the quantity of electrical energy stored in the cell 18 is zero, that is, no electrical energy can be extracted from the cell 18 to energize an electric load.

The parameters $C_n^{ini}$, $RO^{ini}$, $I_{max}$, $U_{max}$, $U_{min}$ and the function $OCV(SOC_k)$ are known parameters of the cell. They are typically either provided by the cell's maker or determined experimentally from measurements performed on the cell.

The battery 10 comprises for each cell, a voltmeter 34 and an ammeter 36. The voltmeter measures the voltage between the cell's terminals. The ammeter measures the cell's charging and discharging current. To keep FIG. 1 simple, only one voltmeter 34 and one ammeter 36 of the cell 18 have been shown.

Unlike the different parameters of the cell 18 introduced above, the cell's state-of-charge $SOC_k$ cannot be measured. Instead, it must be estimated. The task of estimating the state-of-charge falls on a battery-management system 40. This battery-management system 40 has, among its functions, the task of determining both the battery's state-of-charge and its state-of-health. In order to determine this state-of-charge and this state-of-health, the battery-management system 40 estimates the state-of-charge and the state-of-health of each cell of the battery 10. A cell's state-of-health at time k, denoted herein by $SOH_k$, represents how much it has aged. A good measure for a cell's state-of-health is the ratio $C_{n,k}/C_n^{ini}$. To calculate the cell's state-of-health, the battery-management system 40 estimates its capacity $C_{n,k}$ at time k.

To perform these various estimations, the battery-management system 40 is electrically connected to each voltmeter and each ammeter of the battery 10 in order to acquire the measurements of voltage and current between the terminals of each cell.

The battery-management system 40 comprises a memory 42 and a programmable electronic computer 44 that executes instructions recorded in the memory 42. The memory 42 stores instructions for execution of the method shown in FIG. 8. It also contains the initial values of the different parameters needed to execute this method.

Figure 2:
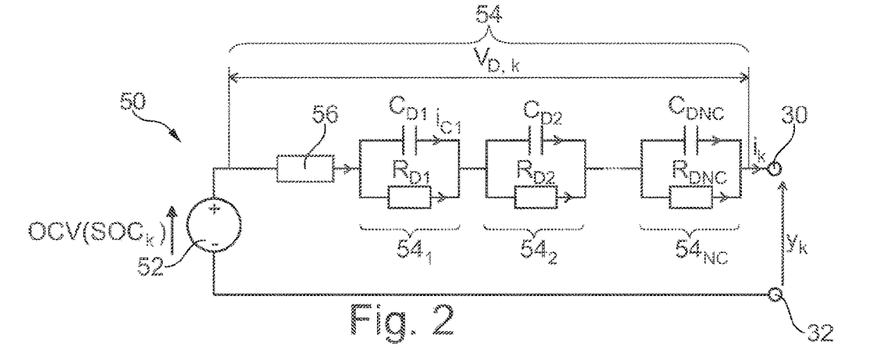
FIG. 2 is a schematic illustration of a circuit model of a cell of the battery of the vehicle of FIG. 1.

FIG. 2 shows a circuit model 50 of the cell 18. This model comprises, connected in succession in series starting from the second terminal 32 and ending at the first terminal 30 a generator 52 of no-load voltage $OCV(SOC_k)$, and an impedance 54.

The impedance 54 comprises a resistance 56 and $N_c$ parallel RC circuits $54_L$ that are connected in series. The index L is an index between 1 and $N_c$ that identifies a particular RC circuit of the circuit model 50. The resistance 56 corresponds to the internal resistance of the cell 18. Each parallel RC circuit $54_L$ comprises a capacitor of capacitance $C_{DL}$ connected in parallel with a resistor of value $R_{DL}$. The resistance 56 and the two parameters $C_{DL}$ and $R_{DL}$ of each parallel RC circuit are unknown and thus need to be determined. The voltage at the terminals of the impedance 54 at time k is denoted as $V_{D,k}$. The value of the voltage between the first and second terminals 30, 32 at time k is denoted as $y_k$ and the charging or discharging current of the cell 18 at the same time is denoted as $i_k$.

Figure 3:
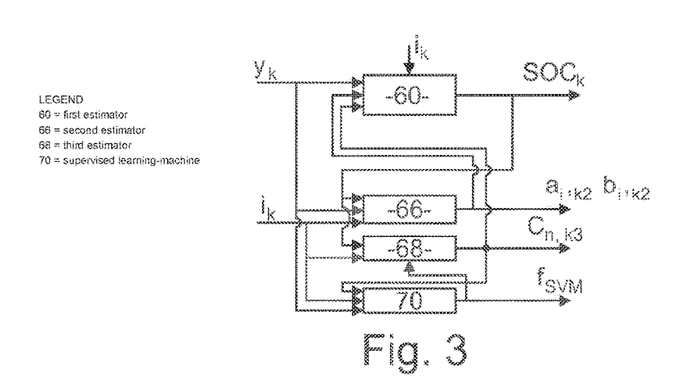
FIG. 3 is a schematic illustration of an arrangement of estimators used to estimate the state-of-charge of a cell of the battery of the vehicle of FIG. 1, FIGS. 4 to 7 represent equations of the different state models and observation models used by the estimators of FIG. 3.

FIG. 3 represents a first embodiment of an arrangement of estimators implemented in the battery-management system 40 to estimate the capacity of the cell 18 and its state-of-charge. Each estimator is implemented in the form of an estimation algorithm executed by the computer 44. Thus, we shall speak hereinafter of "the execution of an estimator" and "the execution of an estimation algorithm" interchangeably.

Figure 4:
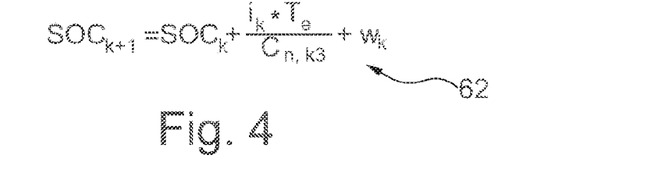
Figure 5:
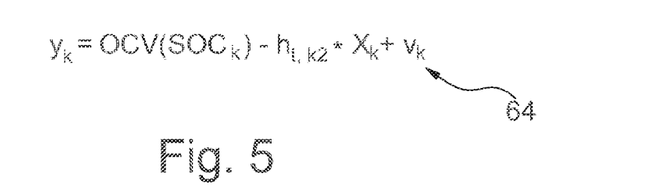

In this first embodiment, the battery-management system 40 comprises a first estimator for estimating the state-of-charge $SOC_k$ from the measured voltage $y_k$ and the measured current $i_k$. The first estimator 60 is implemented as a Kalman filter that uses a first state model 62 and a first observation model 64. These are shown in FIGS. 4 and 5 respectively using the previously defined notations. The notations $h_{t,k2}$ and $C_{n,k3}$ represent, respectively, a filter and the capacity of the cell 18 at times k2 and k3. Typically, the times k2 and k3 each belong to a subset of the set of times k. In both the first state model 62 and the first observation-model 64, the times k2 and k3 are the times of these subsets that are the closest to the time k. In the first state-model 62, $SOC_k$ is the state variable.

In the following discussion, the temporal origin corresponds to the zero value of time k. In these conditions, the time that corresponds to the index k is equal to $kT_e$, where $T_e$ is the sampling period for the measurements of the ammeters and voltmeters of the battery 10. Thus, $T_e$ is the period of time separating any two acquisitions k and k−1 of voltage and current by the battery-management system 40. For practical systems, the period $T_e$ is typically a constant between 0.1 seconds and 10 seconds. In the embodiment described herein, $T_e$ is equal to 1 second plus or minus 20%.

In the first state-model 62, $w_k$ is state noise. In the embodiment described herein, the state noise $w_k$ is centered Gaussian white noise. This noise represents the uncertainty in the model. The covariance matrix at time k that corresponds to the noise $w_k$ is $Q_k$, which is given by $Q_k = E(w_k \cdot w_k^T)$, where E( . . . ) is the mathematical expectation function. The first state-model 62 is likewise written in the form $X_{k+1} = F_k + B_k i_k + w_k$, where $F_k$ is the state transition matrix at time k and $B_k$ is the control vector at time k. The first state-model 62 allows prediction of the state-of-charge $SOC_{k+1}$ at time k+1 from the preceding state-of-charge $SOC_k$.

The first observation-model 64 allows prediction of the voltage $y_k$ at time k from the state-of-charge $SOC_k$ and a vector $X_k$. In the first observation-model 64, $X_k$ is the vector $[i_k, i_{k-1}, \ldots, i_{k-Nh}, V_{D,k-1}, V_{D,k-2}, \ldots, V_{D,k-Mh}]^T$, where "$T$" represents transposition. Nh and Mh are predetermined positive integers that are greater than or equal to two. Preferably, Nh and Mh belong to the set [3 . . . 10]. In the embodiment described herein, Nh and Mh are both equal to four.

The product $h_{t,k2} \cdot X_k$ returns a prediction $Vp_{D,k}$ of the voltage $V_{D,k}$ at the terminals of the impedance 54. In this embodiment, the impedance 54 is simulated by an infinite impulse-response filter $h_{t,k2}$ defined by:

$$V_{P_{D,k}} = h_{t,k2} * X_k = \sum_{i=0}^{i=Nh} b_{i,k2} * i_{k-i} - \sum_{i=1}^{i=Mh} \alpha_{i,k2} * V_{D,k-i}$$

where $b_{i,k2}$ and $a_{i,k2}$ are the filter coefficients $h_{t,k2}$ updated at the time k2 that is the closest to the time k.

In the first observation-model 64, $v_k$ is centered Gaussian white measurement noise. The covariance matrix of the noise $v_k$ at time k is denoted as $R_k$. In the particular case described herein, this matrix $R_k$ is a matrix of a single column and a single row. It is defined by the relation $R_k = E(v_k \cdot v_k)$. The noise $v_k$ is independent of the noise $w_k$ and of the initial state-of-charge $SOC_0$.

The first observation-model 64 is nonlinear since the function $OCV(SOC_k)$ is generally nonlinear. Because of this, the first estimator 60 implements the sigma point version of the Kalman filter. The implementation of a similar sigma point Kalman filter is described in detail in Julier J. Simon et al: "*A New Extension of the Kalman Filter to Nonlinear Systems,*" Proc. SPIE 3068, Signal Processing, Sensor Fusion, and Target Recognition VI, 182 (28 Jul. 1997) and in Gregory L. Plett: "Sigma-point Kalman filtering for battery management systems of LiPB-based HEV battery packs," Journal of Power Sources 161 (2006) 1356-1368.

The first estimator 60 needs to know the capacity $C_{n,k3}$ and the filter coefficients $h_{t,k2}$ in order to be able to estimate the state-of-charge $SOC_{k+1}$. The capacity and the filter coefficients $h_{t,k2}$ of the cell 18 vary as the cell 18 ages. In order to take this aging into account, the capacity and the filter coefficients $h_{t,k2}$ of the cell 18 are estimated, respectively, at times k3 and k2. A second estimator 66 estimates the filter coefficients $h_{t,k2}$ from the measured voltage $y_{k2}$, from the measured current $i_{k2}$, and from the state-of-charge $SOC_{k2}$. A third estimator 68 estimates the capacity $C_{n,k3}$ from the current $i_{k3}$ and the state-of-charge $SOC_{k3}$.

The filter coefficients $h_{t,k2}$ and the capacity of the cell 18 vary more slowly than its state-of-charge. Thus, in order to limit the computational load that would otherwise be needed to estimate the state-of-charge of the cell, and to do so without significantly impacting the estimate, the second and third estimators 66, 68 are executed less frequently than the first estimator 60. In particular, the second and third estimators 66, 68 execute only at times k2 and k3, which are subsets of the set of times k. Consequently, between two successive times k2 and k2−1 and between two successive times k3 and k3−1, there elapse several periods $T_e$ and several times k.

The second estimator 66 implements a recursive least-squares algorithm.

The third estimator 68 is implemented as a Kalman filter. It uses a second state model 74, shown in FIG. 6, and a second observation model 76, shown in FIG. 7. In the second state-model 74 and in the second observation-model 76, the noises $w_{3,k3}$ and $v_{3,k3}$ are centered Gaussian white noise. The covariances of the noises $w_{3,k3}$ and $v_{3,k3}$ are denoted respectively as $Q_{3,k3}$ and $R_{3,k3}$.

Figure 6:
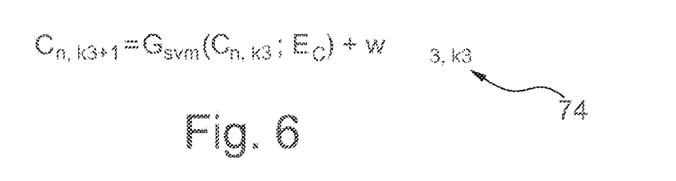

In the second state-model 74, the function $G_{SVM}$ is a function that returns the capacity $C_{n,k3}$ from the capacity $C_{n,k3-1}$ and from a physical-characteristic set Ec of physical characteristics $cc_{j,k3}$ measured or estimated at time k3 on the cell 18 or on the vehicle 2. The physical characteristics $cc_{j,k3}$ that belong to the physical-characteristic set Ec all exert an influence that changes the cell's capacity over time. Thus, they are correlated with the change over time in the cell's capacity.

The physical-characteristic set Ec comprises at least one principal physical characteristic $cc_{1,k3}$, and, preferably, one or more supplemental physical characteristics $cc_{j+1,k3}$, where the index j is a constant integer greater than or equal to one. In some embodiments, j is less than five. In others, j is less than three. Typically, at least one characteristic belongs to the physical-characteristic set Ec is either the current $i_{k3}$ or the voltage $y_{k3}$.

Preferably, the principal physical characteristic $cc_{1,k3}$ is the current $i_{k3}$. This is because the charging or discharging current of the cell 18 is correlated with variation in the capacity over the course of time. It is also preferable for a supplemental physical characteristic $cc_{2,k3}$ to be the measured voltage $y_{k3}$ because voltage between the cell's terminals 30, 32 is correlated with the variation in the capacity of the cell.

Other supplemental characteristics, if available, are the cell's temperature $T_{k3}$ as measured at time k3 and its depth-of-discharge $DoD_{k3}$, which can be derived from the relationship: $DoD_{k3}=1-SOC_{k3}$. Any other physical characteristic that is correlated with variation in the cell's capacity be incorporated into the physical-characteristic set Ec. Examples of other such physical characteristic include the vehicle's acceleration or its speed. However, in the particular embodiment described herein, the physical-characteristic set Ec contains only two characteristics $cc_{1,k3}$ and $cc_{2,k3}$, which correspond to the measured current $i_{k3}$ and the measured voltage $y_{k3}$.

Figure 7:
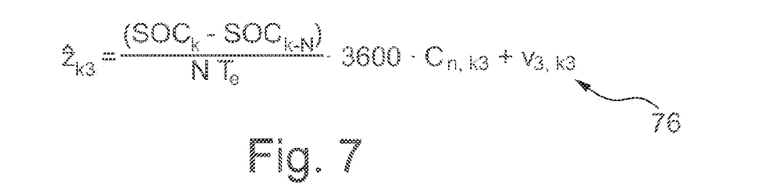

Preferably, the function $G_{SVM}$ is defined by $Gs(C_{n,k3-1};Ec)=C_{n,k3-1}+f_{SVM}(Ec)$, where $f_{SVM}(Ec)$ is a learned function that returns the difference between the capacities $C_{n,k3}$ and $C_{n,k3-1}$ as a function of the physical characteristics of the physical-characteristic set Ec. In this form, the second state-model 74 is a linear function of capacity $C_{n,k3}$. The second observation-model 76 is thus also a linear model. Because of this, it is not necessary to implement a Kalman filter that linearizes these models about the capacity $C_{n,k3}$. This avoids the approximation errors that inevitably occur during such linearization. As a result, the estimate of capacity improves. In this case, a simple Kalman filter implements the third estimator 68, instead of an extended Kalman filter.

The second observation-model 76 permits estimation of a directly-measurable physical quantity $z_{k3}$. The physical quantity $z_{k3}$ is the sum of the last N measured currents $i_k$:

$$z_{k3} = \sum_{m=k-N}^{m=k-1} i_m$$

In the above relation and in the second observation-model 76, the time k is equal to the time k3. The physical quantity $z_{k3}$ takes into account not only the current $i_{k-1}$ measured at time k−1 preceding time k3 but also the previous N currents measured between the times k3 and k3−1. The integer N is greater than one and is counted as shall be described further below. Consideration of intermediate measurements between the times k3 and k3−1 makes it possible to more accurately estimate the cell's capacity $C_{n,k3}$.

In this embodiment, the learned function $f_{SVM}$ of the second state-model 74 is initially learned from an experimental database. It is then relearned during use of the battery-management system 40 in the vehicle 2. For this purpose, the battery-management system 40 thus also implements a supervised learning machine 70 and includes a database 71 that contains the data necessary for the learning. The supervised learning machine 70 and the database 71 are shown in FIGS. 3 and 1 respectively.

The supervised learning machine 70 operates, alternately or at the same time, in two different modes: a "learning mode" and a "utilization mode."

In the learning mode, the supervised learning machine 70 builds a database containing, for a very large number of times k3, the capacity $C_{n,k3}$ and the characteristics of the physical-characteristic set Ec as measured or estimated at the same time. In this embodiment, for this purpose, the supervised learning machine 70 receives the current is, the measured voltage $y_{k3}$ and the capacity $C_{n,k3}$ estimated by the third estimator 68. The very large number of times k3 taken into consideration to build the database is, for example, greater than fifty or a hundred.

Once the database 71 contains enough data, the supervised learning machine 70, which is still operating in learning mode, executes a supervised learning algorithm to learn the learned function $f_{SVM}(Ec)$. This learning is executed at times k4 which are, typically, less frequent than the times k3. For example, the number of times k4 in which learning is executed is at least five, ten, or a hundred times less than the number of times k3. A suitable algorithm for supervised learning is a support vector machine. Such a machine automatically constructs hyperplanes that make it possible to separate the physical characteristics belonging to the physical-characteristic set Ec into different classes. Each class is associated with a particular value of the difference between the capacities $C_{n,k3}$ and $C_{n,k3-1}$. In order to sort the physical characteristics of the physical-characteristic set Ec into different classes, the supervised learning machine 70 effectuates changes in a system of nonlinear axes. The effectuation of such changes is known in the literature as a "kernel trick."

Classically, before launching the learning of the learned function $f_{SVM}$, parameters C, ε and γ of the supervised learning machine 70 need to be adjusted. The parameter C is the penalty parameter for the error term. It governs the complexity of the hyperplane to be sought given that classification errors are punished more or less harshly. The parameter ε governs the extent of the margin permitted. It characterizes the precision that one should have in the regression. The parameter γ represents the parameter of the Gaussian kernel, and thus controls the extent of the maneuvering margin in the context of the kernel trick. These parameters are adjusted by applying the method described in V. Cherkassky: Yunqian Ma Vladimir Cherkassky: "Practical selection of svm parameters and noise estimation for svm regression," ELSEVIER, Neural Networks, 2003.

The supervised learning machine 70 is realized, for example, from the toolkit "libsvm," which can be downloaded from many Internet sites, such as the site http://www.csie.ntu.edu.tw/~cjlin/libsvm/. This toolkit has the advantage of easily interfacing with a large number of programs, such as MATLAB®.

Once the learned function $f_{SVM}$ has been learned, the supervised learning machine 70 can function in the utilization mode. In utilization mode, at each time k3, the supervised learning machine 70 receives the values of the characteristics belonging to the physical-characteristic set Ec. In response, it returns to the value of the learned function $f_{SVM}(Ec)$ at time k3 to the third estimator 68.

Figure 8:
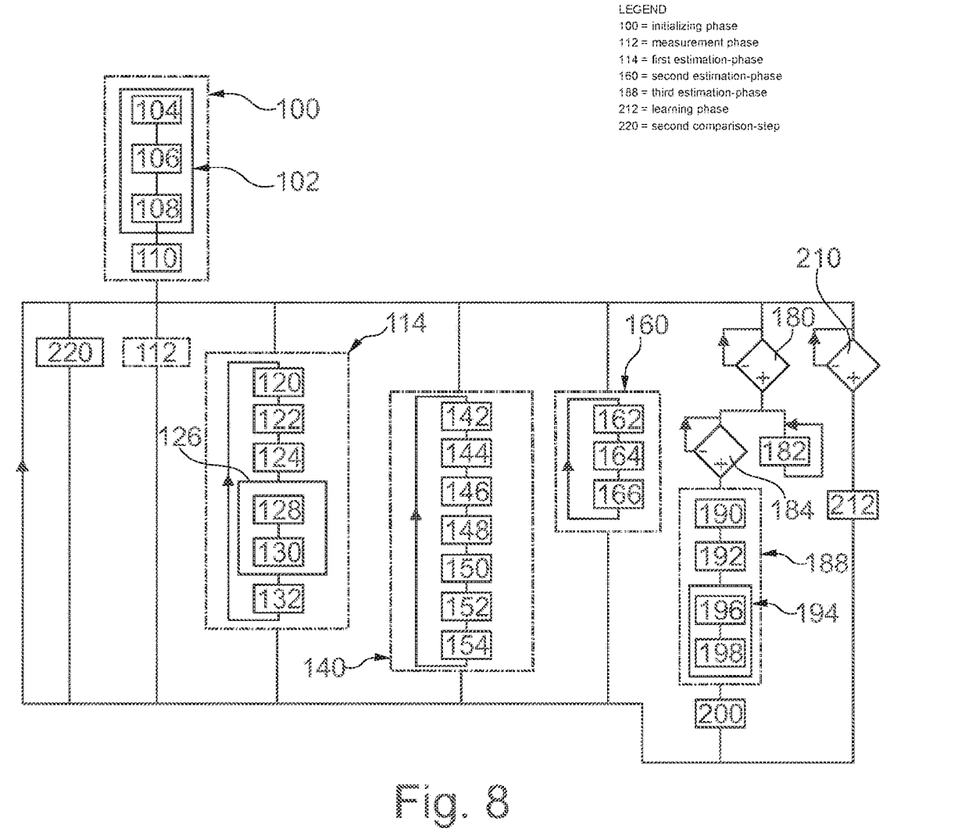
FIG. 8 is a flow chart of a method for estimating the cell's state-of-charge with the aid of the estimators of FIG. 3.

The battery-management system 40 implements a method shown in FIG. 8 for estimating a cell's state-of-charge.

Before estimation can actually begin, it is necessary to initialize the battery-management system 40. This takes place during an initializing phase 100 that has an initial learning-step 102 and a covariance-adjustment step 110.

During the initial learning-step 102, the supervised learning machine 70 performs an initial learning of the learned function $f_{SVM}$. The initial learning-step 102 includes a first operation 104 during which the current $i_k$, the measured value $y_k$, and the capacity of the cell 18 are recorded in a database at many different times. Typically, the first operation 104 is performed in the laboratory and on a cell identical to the cell 18, though not necessarily the actual cell 18 itself. In the laboratory, it is possible to measure the cell's capacity $C_{n,k}$ at each time k. Such measurement can be carried out by impedance spectroscopy or by electrochemical impedance spectroscopy.

The initial learning-step 102 also includes a second operation 106 during which the supervised learning machine 70 acquires the database that was constructed during the first operation 104. This is where the learning database 71 shown in FIG. 1 comes from. The learning database 71 is stored in the battery-management system's memory 42.

Referring again to FIG. 8, during a third operation 108 of the initial learning-step 102, the supervised learning machine 70 executes the supervised learning algorithm to learn the initial learned function $f_{SVM}$. It does so by using the data recorded in the newly-created database 71. After having been learned for the first time, the learned function $f_{SVM}$ is then recorded in the memory 42. This completes the initial learning-step 102 of the initializing phase 100.

During the covariance-adjustment step 110 of the initializing phase 100, the covariance matrices $Q_0$ and $R_0$ of the first estimator 60 are adjusted by implementing any of a variety of conventional methods. In some implementations, the covariance matrix $R_0$ is adjusted using data provided by the manufacturer of the sensors. In others, it is adjusted using tests performed on these sensors. The covariance matrix $Q_0$ is adjusted by successive tests. As an illustration, the matrix $Q_0$ is taken to be equal to $10^{-3}$.

Also during the covariance-adjustment step 110 of the initializing phase 100, the covariances $Q_{3,0}$ and $R_{3,0}$ of the third estimator 68 are adjusted. In some implementations, the covariance $Q_{3,0}$ is taken to be equal to $[\gamma_c \cdot C_n^{ini}/(3 \cdot N_{eol}^C \cdot N_S)]^2$, where $\gamma_c$ represents, expressed as percentage divided by 100, the difference between the cell's initial capacity $C_n^{ini}$ and its end-of-life capacity. The parameter $\gamma_c$ is a constant chosen by the user. Suitable values are between 0.05 and 0.8, preferably between 0.05 and 0.3. In the embodiment described herein, $\gamma=0.2$.

In some embodiments, the covariance $R_{3,0}$ is $[2 \cdot \varepsilon_{im} \cdot I_{max}/300]^2$, where $\varepsilon_{im}$ is the maximum error of the ammeter 36 expressed in percent.

In what follows, to simplify the description, the covariances $Q_{3,k3}$ and $R_{3,k3}$ are considered to be constant and are taken to be equal, respectively, to $Q_{3,0}$ and $R_{3,0}$. However, in some embodiments they are updated at each time k3, for example, as a function of differences between measured and predicted values over time. Such updating is carried out by applying known methods.

Once the initializing phase 100 has finished, estimation of the cell's state-of-charge begins.

The estimation procedure begins with a measurement phase 112 during which, at each time k, the voltmeter 34 and the ammeter 36 measure the voltage $y_K$ and the current $i_k$. The battery-management system 40 immediately acquires these measurements and records them in the memory 42. The battery-management system 40 then repeats the measurement phase 112 for the next time k.

In this embodiment, if the filter coefficients $h_{t,k2}$ are not known, the first estimator 60 cannot be executed. Therefore, some way must be found to determine them. This is carried out by a first estimation-phase 114 that is executed in parallel with measurement phase 112. During the first estimation-phase 114, the computer 44 estimates the cell's state-of-charge $SOC_k$ with the help of another estimation algorithm, namely one that does not use the filter coefficients $h_{t,k2}$, which after all, are unknown. This other algorithm is an extended Kalman filter that uses a third state model 116, which is shown in FIG. 9, and a third observation model 118, which is show in in FIG. 10.

The third state-model 116 is obtained from a simplified circuit model of the cell 18 in which the impedance 54 comprises only a single parallel RC circuit instead of multiple such circuits in series. The resistance $R_D$ and the capacitance $C_D$ of this parallel RC circuit are furthermore considered to be predetermined constants. The voltage $V_{Diff,k}$ is the voltage at time k on the terminals of this RC circuit. This voltage $V_{Diff,k}$ is not directly measurable. Thus, in the third state-model 116, the voltage $V_{Diff,k}$ is treated as a supplemental state variable to be estimated. The third state-model 116 also assumes that the cell's capacity remains equal to its initial capacitance $C_n^{ini}$. This assumption introduces only a slight error because the first estimation-phase 114 is executed just after the start of the utilization of the battery-management system 40. This means that the cell 18 would not yet have had much time to age.

Figure 10:
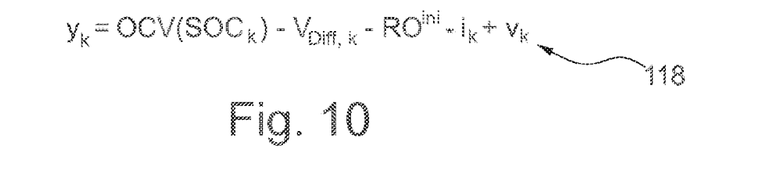

The third observation-model 118 is identical to the first observation-model 64 except that the sum $V_{Diff,k}+RO^{ini} \cdot i_k$ replaces the product $h_{t,k2} \cdot X_k$ as the initial value of the cell's internal resistance, $RO^{ini}$. In this third observation-model 118, the cell's internal resistance $RO^{ini}$ is a constant. Again, this assumption introduces only a very small error because the first estimation-phase 114 is executed just after the start of the utilization of the battery-management system 40. This means that the cell 18 would not yet have had time to age.

Figure 9:
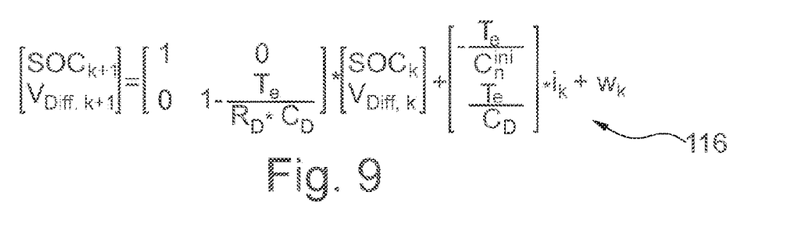
FIGS. 9 and 10 represent, respectively, a state model and a observation model used in the method of FIG. 8.

As is apparent from FIGS. 9 and 10, both the third state-model 116 and the third observation-model 118 are independent of the filter coefficients $h_{t,k2}$. It is thus possible to begin estimating the state-of-charge $SOC_k$ using these models without having to wait for the filter coefficients $h_{t,k2}$ to be determined.

During the first estimation-phase 114, the covariance matrices of the centered Gaussian white noises $w_k$ and $v_k$ of the third state-model 116 and the third observation-model 118 are adjusted in a manner similar to that already described in connection with the covariance-adjustment step 110 that occurs during the initializing phase 100. To simplify matters, these covariance matrices are assumed to be constant. Thus, during the first estimation-phase 114, the covariance matrices $R_k$ and $Q_k$ at time k are equal, respectively, to the matrices $R_0$ and $Q_0$ for all times k.

Next, during a first step 120 of the first estimation-phase 114, the computer 44 calculates: (1) a prediction $S\hat{O}C_{k/k-1}$ of the cell's state-of-charge at time k, and (2) a prediction $V_{Diff,k/k-1}$ of the voltage $V_{Diff,k}$ present at the terminals of the RC circuit at time k. The index "k/k−1" shows that this prediction is done by only accounting for the measurements performed between times 0 and k−1. Such a prediction is an "a priori" prediction. The index "k/k" shows that the prediction at time k takes account of the set of measurements performed between times 0 and k. Such a prediction is an "a posteriori" prediction. The predictions $S\hat{O}C_{k/k-1}$ and $V_{Diff,k/k-1}$ are calculated with the help of the third state-model 116, the measured current $i_{k-1}$ and the cell's initial capacity $C_n^{ini}$.

During a second step 122 of the first estimation-phase 114, the computer 44 calculates the prediction $P_{k/k-1}$ of a covariance matrix for the error in the estimate of the state vector. The state vector is the vector $[SOC_k; V_{Diff,k}]^T$. Typically, this is done with the help of the relation:

$$P_{k/k-1}=F_{k-1}P_{k-1/k-1}F_{k-1}^T+Q_{k-1}$$

where $F_{k-1}$ is the state transition matrix at time k−1. In the third state-model 116, the state transition matrix is constant. The matrices $P_{k-1/k-1}$ and $Q_{k-1}$ have already been defined above.

Next, during a third step 124 of the first estimation-phase 114, the computer constructs a matrix $H_k$ by linearizing the third observation-model 118 about the predictions $\hat{SOC}_{k/k-1}$ and $V_{Diff,k/k-1}$. The third observation-model 118 is nonlinear, because the function $OCV(SOC_k)$ is nonlinear. Because of this, the computer 44 implements the extended version of the Kalman filter. In this extended version, one ends up with a linear observation model of the form $y_k = H_k + RO^{ini} \cdot i_k + v_k$ by linearizing the third observation-model 118 in the neighborhood of the vector. This is typically carried out by developing the third observation-model 118 into a Taylor series in the neighborhood of the vector and disregarding the contributions of all derivatives beyond and including the second order. The matrix $H_k$ is thus equal to the first derivative of the function OCV in the neighborhood of the state-of-charge $SOC_k$. This linearization of the third observation-model 118 is typically done for each new value of the state-of-charge $SOC_k$.

After this, during a fourth step 126 of the first estimation-phase 114, the computer 44 corrects the predictions $\hat{SOC}_{k/k-1}$ and $V_{Diff,k/k-1}$ s a function of a difference between the measured voltage $y_k$ and a predicted voltage $\hat{y}_k$ from the third observation-model 118. This fourth step 126 typically involves a first operation 128 and a second operation 130.

The first operation 128 calculates the predicted voltage $\hat{y}_k$. It does so with the help of the third observation-model 118, in which the value of the state-of-charge is taken to be equal to $\hat{SOC}_{k/k-1}$ and the value of the voltage $V_{Diff,k}$ is taken to be equal to $V_{D,k/k-1}$. The difference between the measured value $y_k$ and its prediction $\hat{y}_k$ is henceforth denoted as $E_k$.

The second operation 130 corrects the predictions $\hat{SOC}_{k/k-1}$ and $V_{D,k/k-1}$ and the matrix $P_{k/k-1}$ to obtain the corrected predictions $\hat{SOC}_{k/k}$, $V_{Diff,k/k}$ and $P_{k/k}$. There are many methods for correcting the a priori estimates $\hat{SOC}_{k/k-1}$ and $V_{Diff,k/k-1}$ based on the difference $E_k$. In the embodiment described herein, the second operation 130 does so with the help of the Kalman gain $K_k$. The Kalman gain $K_k$ is given by $K_k = P_{k/k-1} H^T_k (H_k P_{k/k-1} H^T_k + R_k)^{-1}$. The a priori predictions are then corrected with the help of the relation: $x_{k/k} = x_{k/k-1} + K_k E_k$.

The matrix $P_{k/k-1}$ is corrected with the help of the relation: $P_{k/k} = P_{k/k-1} - K_k H_k P_{k/k-1}$.

Finally, during a final step 132 of the first estimation-phase 114, the predicted and corrected estimate $SOC_k$, the measured current $i_k$ and the measured voltage $y_k$ are recorded in a particular table of the database 71.

The steps of the first estimation-phase 114 are repeated $K_{114}$ times. Preferably at each successive time k, $K_{114}$ is greater than Nh+Mh+1, and typically greater than fifty. Generally, $K_{114}$ is less than 1000 to avoid having the first estimation-phase 114 last too long. In the illustrated embodiment, $K_{114}$ is equal to 100. For the particular hardware used, this would take the first estimation-phase 114 around one minute and forty seconds to fill the database 71 with enough data to effectively determine the filter coefficients $h_{t,k2}$. During each new iteration of the first estimation-phase 114, the state vector $x_{k-1}$ is initialized with the values obtained during the preceding iteration of the first estimation-phase 114 for that cell 18.

At a time k2, once there has been enough data stored in the database 71, the computer 44 triggers execution of the second estimator 66. From that time on, during an updating phase 140, the computer 44 updates the filter coefficients $h_{t,k2}$.

During a first step 142 of the updating phase 140, the computer 44 initializes the values of the coefficients $a_{i,k2-1}$ and $b_{i,k2-1}$ of the filter $h_{t,k2-1}$ estimated at time k2−1. For the first execution of the updating phase 140, these are initialized at predetermined values. If the updating phase 140 has already been executed, the coefficients $a_{i,k2-1}$ and $b_{i,k2-1}$ are initialized with their values as obtained at the end of the preceding execution of the updating phase 140 at time k2−1.

In addition, during the first step 142 of the updating phase 140, the computer 44 also initializes a covariance matrix $P_{RLS,k2-1}$. During the first execution of the updating phase 140, the coefficients of this matrix $P_{RLS,0}$ are taken to be equal to certain values that have been prerecorded in the memory 42. In some practices, the values of the coefficients of this matrix are taken to be equal to $10^6$ in order to show that the uncertainty in the initial values of the coefficients $a_{i,k2-1}$ and $b_{i,k2-1}$ is at its maximum. During the following iterations of the updating phase 140, the coefficients of the matrix $P_{RLS,k2-1}$ are taken to be equal to the coefficients of this matrix as obtained at time k2−1.

During a second step 144 of the updating phase 140, at time k2, the second estimator 66 acquires the vector $X_{k2}$. In this vector $X_{k2}$, the currents $i_k$ to $i_{k-Nh}$ and the voltages $V_{D,k-1}$ to $V_{D,k-Mh}$ are retrieved from the database 71 using as time k the time closest to time k2. For example, during the second step 144, k is taken to be equal to k2. More precisely, the voltage $V_{D,k-i}$ is obtained from the difference between the measured voltage $y_{k-i}$ and the no-load voltage OCV $(SOC_{k-i})$, where the measured voltage $y_{k-i}$ and the state-of-charge $SOC_{k-i}$ are retrieved from the database 71 for the time k−i. During this step, the second estimator 66 likewise acquires the measured current $i_k$ and the measured voltage $y_k$.

During a third step 146 of the updating phase 140, the second estimator 66 calculates a gain $K_{RLS,k2}$. In the particular embodiment described herein, this gain is calculated with the help of the following relation:

$$K_{RLS,k2} = (X_{k2}^T \cdot P_{RLS,k2-1})/(\lambda_{RLS} + X_{k2}^T \cdot P_{RLS,k2-1}),$$

where the coefficient $\lambda_{RLS}$ is a predetermined constant known as the "omission factor." This constant is between 0 and 1. Preferably, $\lambda_{RLS}$ is chosen greater than or equal to 0.9. In the embodiment described herein, $\lambda_{RLS}$ is equal to 0.99.

During a fourth step 148 of the updating phase 140, the second estimator 66 calculates a prediction $Vp_{D,k2}$ of the voltage $V_{D,k2}$ with the help of the following relation: $Vp_{D,k2} = h_{t,k2-1}^T \cdot X_{k2}$.

Next, during a fifth step 150 of the updating phase 140, the second estimator 66 calculates the difference $e_{RLS,k2}$ between the measured voltage $V_{D,k2}$ and its predicted value $Vp_{D,k2}$. The measured voltage $V_{D,k2}$ is obtained from the difference $y_{k2} - OCV(SOC_{k2})$, where the measured value $y_{k2}$ is the value acquired during the second step 144 of the updating phase 140.

During a sixth step 152 of the updating phase 140, the second estimator 66 corrects the values of the old coefficients $a_{i,k2-1}$ and $b_{i,k2-1}$ to obtain new coefficients $a_{i,k2}$ and $b_{i,k2}$ that further minimize the difference $e_{RLS,k2}$. The filter with the coefficients $a_{i,k2}$ and $b_{i,k2}$ is denoted as $h_{t,k2}$. In the embodiment described herein, the new coefficients $a_{i,k2}$ and $b_{i,k2}$ are determined with the help of the relation: $h_{t,k2} = h_{t,k2-1} + K_{RLS,k2} \cdot e_{RLS,k2}$.

Finally, during a seventh step 154 of the updating phase 140, the covariance matrix $P_{RLS,k2-1}$ is updated to obtain the new matrix $P_{RLS,k2}$. In the embodiment described herein, this is done with the help of the relation: $P_{RLS,k2} = (P_{RLS,k2-1} - K_{RLS,k2} \cdot X_{k2}^T \cdot P_{RLS,k2-1})/\lambda_{RLS}$.

The updating phase 140 repeats $K_{140}$ times in a row to obtain a good estimate of the filter coefficients $h_{t,k2}$. In the embodiment described herein, the updating phase 140 repeats at each time k between time k and time k+$K_{140}$, where $K_{140}$ is greater than 50 and generally less than 1000.

In the embodiment described herein, $K_{140}$ is equal to 100. In the embodiment described herein, the updating phase 140 halts when one of the following conditions is met: (1) $K_{140} \geq 50$ and $P_{RLS,k} \leq S_{PRLS}$; or (2) $K_{140} = 100$. The threshold $S_{PRLS}$ is a predetermined threshold for the covariance of the error of estimation of the coefficients $a_{i,k2}$ and $b_{i,k2}$.

The cessation of the updating phase 140 triggers execution of the first estimator 60. This triggers execution of a second estimation-phase 160 that estimates the state-of-charge $SOC_k$. At the same time, the first estimation-phase 114 halts. In fact, the first estimator 60 provides a more precise estimate of the state-of-charge $SOC_k$ than that obtained by the estimation algorithm carried out during the first estimation-phase 114.

In order to estimate the state-of-charge $SOC_k$, the first estimator 60 systematically uses the last known values of the filter coefficients $h_{t,k2}$ and of the capacity $C_{n,k3}$. Thus, as long as no capacity $C_{n,k3}$ has been estimated by the third estimator 68, it is the cell's initial capacity $C_n^{ini}$ that will be used. The functioning of the second estimation-phase 160 may be inferred from the previous teaching and that contained in the preceding articles dealing with sigma point Kalman filters.

The second estimation-phase 160 involves a SOC-prediction step 162, a voltage-prediction step 164, and a correction step 166.

The SOC-prediction step 162 calculates a prediction $S\hat{O}C_{k/k-1}$ of the state-of-charge of the cell 18 with the help of the first state-model 62. The voltage-prediction step 164 calculates a predicted voltage $\hat{y}_k$ of the measured voltage $y_k$ with the help of the first observation-model $64_y$. The correction step 166 corrects the prediction $S\hat{O}C_{k/k-1}$ to obtain the predicted and corrected state-of-charge $S\hat{O}C_{k/k}$ from the difference between the predicted voltage $\hat{y}_k$ and the measured voltage $y_k$. In the example described herein, the second estimation-phase 160 executes at each time k from the time when the execution of the first estimator 60 was triggered.

In parallel with the measurement phase 112, the first estimation-phase 114, the updating phase 140, and the second estimation-phase 160, the method includes a first comparison-step 180 during which, at each time k, the state-of-charge $SOC_k$ is compared to a predetermined upper threshold $SH_{soc}$. If the state-of-charge $SOC_k$ drops below this threshold $SH_{soc}$, the method continues at once with a counting step 182 and a second comparison-step 184. Otherwise, the first comparison-step 180 is repeated at the next time k. In the embodiment described herein, the threshold $SH_{soc}$ is between 90% and 100%.

During the counting step 182, the computer 44 begins by initializing a counter to zero. It then increments the counter by 1 at each new measurement of the current $i_k$ from the start of the counting step 182. Moreover, at each time k, the measured current $i_k$ and the state-of-charge $SOC_k$ generated at the same time are recorded, in association with time k, in the database 71.

In parallel with counting step 182, during the second comparison-step 184, the computer 44 compares each new state-of-charge $SOC_k$ to a predetermined threshold $SL_{soc}$. In the embodiment described herein, the threshold $SL_{soc}$ lies between 0% and 10%. As long as the state-of-charge $SOC_k$ remains higher than this threshold $SL_{soc}$, the counting step 182 repeats at the following time k. Otherwise, as soon as the cell's state-of-charge $SOC_k$ falls below this threshold $SL_{soc}$, the computer 44 triggers execution of the third estimator 68, and stops incrementing the counter. Thus, as long as this threshold $SL_{soc}$ has not been crossed, the execution of the third estimator 68 remains inhibited.

The third estimator 68 estimates, during a third estimation phase 188, the capacity $C_{n,k3}$ at time k3. Thus, time k3 is equal to time k when the execution of the third estimator 68 is triggered.

As for the updating phase 140, given that the third estimator 68 is not executed at each time k, the time k3−1 does not correspond to the time k−1. On the contrary, the times k3 and k3−1 are separated by an interval of time greater than or equal to $NT_e$ where N is the number counted during step 182.

The parameters of the Kalman filter of the third estimator 68 are initialized with the previous values of these parameters obtained at the end of the previous iteration at time k3−1 of third estimation phase 188.

The third estimation phase 188 includes a first calculating step 190, a second calculating step 192, and a correction step 194.

The first calculating step 190 includes calculating the prediction $C_{n,k3/k3-1}$ with the help of the model 74. During the first calculating step 190, the third estimator 68 uses the last function $f_{SVM}$ learned. Initially, therefore, this is the learned function $f_{SVM}$ that was learned during the initial learning-step 102. On the other hand, if the supervised learning machine 70 has executed a new cycle of learning, then the third estimator 68 uses this last learned function.

For example, in order to learn the value of the learned function $f_{SVM}(Ec)$ at time k3, the parameters of the physical-characteristic set Ec as measured at time k3 are sent to the supervised learning machine 70. In response, the supervised learning machine 70 sends the value of the learned function $f_{SVM}(Ec)$ at time k3 to the third estimator 68. In this embodiment, the supervised learning machine 70 acquires the measured voltage $y_{k3}$ and the measured current s. During the first calculating step 190, the supervised learning machine 70 functions in its utilization mode.

During the second calculation step 192 and the correction step 194, the matrix of observability $H_{3,k3}$ is equal to $[(SOC_k - SOC_{k-N})] \cdot 3600/(NT_e)$, where N is the number of times k elapsed between the time when the estimated state-of-charge has dropped below the threshold $SH_{soc}$ and the time when the estimated state-of-charge has dropped below the threshold $SL_{soc}$. The value of N is equal to the value counted during step 182.

The second calculations step 192 includes calculating the prediction $P_{3,k3/k3-1}$ of the covariance matrix of the error associated with estimating the capacity.

The correction step 194, which includes correcting the predictions, includes a first operation 196 and a second operation 198.

The first operation 196 of the correction step 194 includes acquiring the measured physical quantity $z_{k3}$ and calculation of the prediction $\hat{z}_{k3}$ of the measured physical quantity $z_{k3}$. The acquisition of the measured physical quantity $z_{k3}$ includes calculating the sum of the last N intensities measured between times k−1 and K−N. The prediction $\hat{z}_{k3}$ is obtained from the second observation-model 76.

During the second operation 198 of the correction step 194, the third estimator 68 corrects the prediction $C_{n,k3/k3-1}$ as a function of the difference between the measured quantity $z_{k3}$ and the predicted quantity $\hat{z}_{k3}$. From this, the third estimator 68 obtains the a posteriori estimation of the capacity $C_{n,k3/k3}$. This correction is carried out, for example, as described during the second operation 130 of the fourth step 126 of the first estimation-phase 114.

Next, the capacity $C_{n,k3/k3}$ is sent to the first estimator 60. The first estimator 60 uses this capacity $C_{n,k3/k3}$ to estimate the cell's state-of-charge of the cell 18 at the following times. At the same time, the current $i_{k3}$, the measured voltage $y_{k3}$ and the capacity $C_{n,k3/k3}$ are all recorded in the database 71.

Triggering execution of the third estimator 68 only after having mostly discharged the cell 18 results in improved estimation accuracy while also decreasing the computational load required to carry out the estimation.

At the end of the third estimation phase 188, during an SOH-calculation step 200, the computer 44 calculates the state-of-health $SOH_{k3}$ at time k3 with the help of the formula:

$$SOH_{k3} = C_{n,k3}/C_n^{ini}.$$

The method also includes a verification step 210 during which the computer 44 verifies whether at least one condition for automatically triggering a learning phase 212 has been fulfilled. During a learning phase 212, the learned function $f_{SVM}$ is again learned.

Some embodiments automatically trigger a learning phase 212 whenever the covariance of the estimation error for estimating the capacity $C_{n,k3}$ exceeds a predetermined threshold $S_{PC}$. These embodiments trigger the learning phase 212 at times k4 that form a subset of the times k3.

During a learning phase 212, the supervised learning machine 70 operates in learning mode. More precisely, the supervised learning machine 70 once again executes the supervised learning algorithm. In doing so, it considers the currents $i_{k3}$, the measured voltages $y_{k3}$, and the capacities $C_{n,k3}$, all of which were predicted and corrected by the third estimator 68 at the previous times k3. In some embodiments, the supervised learning machine 70 only takes into account the data recorded in the database 71 since the last time k4−1 that the learning phase 212 was executed. Once the supervised learning machine 70 has learned the new learned function $f_{SVM}$, the third estimator 68 proceeds to use it.

In parallel, during a second comparison-step 220, the computer 44 compares each new measurement of current $i_k$ to a predetermined current threshold $SH_i$. As long as the measured current does not cross this threshold $SH_i$, the computer 44 inhibits execution of the second estimator 66. On the other hand, whenever the measured current $i_k$ crosses this threshold $SH_i$, the second estimator 66 executes at once. The threshold $SH_i$ is generally greater than $I_{max}/2$, and advantageously greater than $0.8 \cdot I_{max}$ or $0.9 \cdot I_{max}$.

The second estimator 66 then executes the updating phase 140 once more to update the estimate of the filter coefficients $h_{t,k2}$ at time k2. In this case, the time k2 is equal to the time k at which the current $i_k$ crosses the threshold $SH_i$.

Triggering execution of the second estimator 66 only when the measured current $i_k$ is elevated improves estimation of the filter coefficients $h_{t,k2}$ while at the same time decreasing the computational load needed to carry out this method. In fact, a synergistic relationship exists because the measurement precision of the ammeter increases as the current $i_k$ increases.

There are many other ways to estimate a cell's state-of-charge. For example, other circuit models and thus other state models can be used to estimate the cell's state-of-charge. A particularly simplified practice simulates the impedance 54 with the aid of a finite impulse response filter. In the preceding description, this amounts to setting Mh to be equal to zero. In this case, Nh is generally chosen to be greater than or equal to ten. A suitable choice of Nh would be fifteen. Other state models are described in WO2006057468, the contents of which are herein incorporated by reference. In particular, the state vector can also be supplemented with the cell's temperature to estimate the temperature and state-of-charge concurrently.

Other observation models are likewise possible for the first estimator 60. For example, in some embodiments, the cell 18 is outfitted with a supplemental sensor, such as a temperature sensor. In this case, the observation model is modified to take into account whatever supplemental measured physical quantities this supplemental sensor senses. Examples of suitably modified observation models are described in WO2006057468 If the observation model used does not use the filter $h_{t,k2}$, then the second estimator 66 is omitted.

Other possible circuit models for simulating the cell 18 are likewise presented in part 2 of Plett 2004, in chapter 3.3.

In alternative embodiments, the first estimator 60 implements the extended version of the Kalman filter instead of the sigma point version.

In yet other embodiments, the first estimator 60 implements something other than a Kalman filter. Among these embodiments are those in which the state-of-charge is estimated by simulating its variation over time in the form of an infinite impulse response filter whose coefficients are estimated by the recursive least square method.

Some embodiments of the first estimator 60 automatically adjust the covariance matrices $R_k$ and $Q_k$ continuously. A suitable covariance-matching method is that described in Mehra, R. K *"On the identification of variances and adaptive Kalman Filtering,"* Automatic Control, IEEE Transaction on, Volume 15, No. 2, pages 175-184, April 1970. This method is applied after an initial setup of the matrices $R_0$ and $Q_0$, for example, as described during the covariance-adjustment step 110.

It is also possible to execute the correction step to correct the prediction. For example, some embodiments correct the prediction of the state-of-charge $SOC_k$ or of the capacity $C_{n,k3}$ by minimizing a quadratic cost function J composed of a first term that is linked to the error of prediction of the measured value and a second term that is linked to the estimation error associated with estimating the state vector. This method is described in detail in chapter 10.5.2 of Y. Bar-Shalom, et al.: "Estimation With Applications to Tracking and Navigation, Theory Algorithms and Software," Wiley Inter-science, 2001.

Some practices do not necessarily execute the first estimator 60 at each time k. In such embodiments, the first estimator 60 retrieves the information needed for execution from values obtained at the end of a previous execution. This is the case, in particular, for the state variables. The preceding execution time is not necessarily the time k−1. Instead, it may be a time k−3 or k−10.

The second estimator 66 can use other algorithms to determine the filter coefficients $h_{t,k2}$. Thus, in some embodiments, the estimator implements the recursive least square global sliding window algorithm. The second estimator 66 can also estimate the capacity of a cell of a battery using the recursive algorithm described in Gregory L. Plett, *"Recursive approximate weighted total least squares estimation of battery cell total capacity,"* Journal of Power Sources 196 (2011) 2319-2331. It is also possible to incorporate the filter coefficients $h_{t,k2}$ in the state vector of the state model and then to use a Kalman filter to estimate these coefficients at the same time as the state-of-charge is estimated. In this latter case, the first state-model 62 is replaced by the following state model:

$$\begin{bmatrix} SoC_{k+1} \\ b_0 \\ b_1 \\ \vdots \\ b_N \\ a_1 \\ \vdots \\ a_M \end{bmatrix} = \begin{bmatrix} SoC_k + \dfrac{i_k \Delta T}{C_k} \\ b_0 \\ b_1 \\ \vdots \\ b_N \\ a_1 \\ \vdots \\ a_M \end{bmatrix} + \begin{bmatrix} w_k \\ w_{k_0} \\ w_{k_1} \\ \vdots \\ w_{k_N} \\ w_{k_{N+1}} \\ \vdots \\ w_{k_{N+M}} \end{bmatrix}$$

where: $b_o$ to $b_N$ and $a_1$ to $a_M$ are the filter coefficients $h_{t,k2}$ and correspond, respectively, to the coefficients $b_{o,k2}$ to $b_{Nh,k2}$ and $a_{1,k2}$ to $a_{Mh,k2}$ previously described. In this latter case, the observation model is unchanged. Thus, it involves the first observation-model 64. In this embodiment, the coefficients $b_o$ to $b_N$ and $a_1$ to $a_M$ are estimated at each time k. However, the first state-model 62 may also be replaced by the above state model only at the times k2, and between two successive times k2, it is the first observation-model 64 which is used.

Initial coefficients $a_{i,0}$ and $b_{i,0}$ of the filter $h_{t,0}$ may be determined in the laboratory by trial-and-error on a cell identical to the cell 18, for example. Then, during the initialization phase 100, the coefficients $a_{i,0}$ and $b_{i,0}$ so determined in the laboratory are recorded in the memory 42 even before the first activation of the battery-management system 40. Thus, starting with the first execution of the method of FIG. 8, the first estimator 60 can be executed by using these prerecorded coefficients $a_{i,0}$ and $b_{i,0}$. In this case, the first estimation-phase 114 is omitted.

Some embodiments trigger execution of the second estimator 66 differently. For example, some embodiments trigger the second estimator 66 periodically, thus omitting the need for the second comparison-step 220.

Depending on the observation model used by the third estimator 68, the quantity $z_{k3}$ may be calculated differently. In some embodiments, the quantity $z_{k3}$ is equal to the sum of the last N intensities measured between the times k and k−N+1. In this case, when N is equal to 1, $z_{k3}=i_{k3}$.

In another embodiment, the function $G_{SVM}(C_{n,k3-1};$ Ec) is not written in the form $C_{n,k3-1}+f_{SVM}(Ec)$. In this case, the function $G_{SVM}(C_{n,k3-1};$ Ec) is generally not a linear function of the capacity $C_{n,k3}$. The third estimator 68 is then implemented, for example, in the form of an extended Kalman filter or a sigma point Kalman filter.

The triggering of the third estimator 68 may be simplified by setting N equal to a predetermined constant. In this case, N is not counted. This makes it possible to omit the first comparison-step 180 and the counting step 182. In some embodiments, N is chosen equal to one or, on the other hand, absolutely greater than one or five or ten. In an even more simplified variant, the triggering of the third estimator 68 in response to the crossing of a threshold is omitted. For example, the third estimator 68 is triggered periodically. This makes it possible to omit the first comparison step 180, the counting step 182, and the second comparison-step 184.

In another embodiment, the covariances $Q_{3,0}$ and $R_{3,0}$ of the third estimator 68 are adjusted as a function of the uncertainty in the learned function $f_{SVM}$ constructed by the supervised learning machine 70 and obtained at the end of the initial learning-step 102.

During the learning phase 212, the physical characteristics of the physical-characteristic set Ec are not necessarily the same as those used during the initial learning-step 102.

In another embodiment, the learning machine that learns the learned function $f_{SVM}$ is mechanically independent of the vehicle 2 and of the cell 18. Among these embodiments are those in which the other learning machine is executed in a laboratory. The learned function $f_{SVM}$ learned by this other machine is then recorded in the memory 42 and used afterwards by the supervised learning machine 70 as the initial learned function $f_{SVM}$ even if this function has not been learned by the supervised learning machine 70 itself. In some embodiments, the other learning machine is identical to the supervised learning machine 70. In this case, the supervised learning machine 70 is not used to learn the initial learned function $f_{SVM}$. As a result, it becomes possible to omit the initial learning-step 102.

A simplified embodiment omits the learning phase 212 altogether. Thus, in this embodiment, the learned function $f_{SVM}$ is never relearned while using the battery-management system 40. The supervised learning machine 70 thus functions only in utilization mode after the initial learning-step 102.

In an even more simplified embodiment, besides omitting the learning phase 212, the learned function $f_{SVM}$ initially learned is not learned with the aid of the supervised learning machine 70 at all. Instead, another supervised learning machine independent of the vehicle 2 learns it. The initial learning-step 102 would then only involve recording the learned function $f_{SVM}$ in the memory 42 after this other machine has learned it. This considerably simplifies the supervised learning machine 70 because it does not have to implement the supervised learning algorithm. It functions solely in utilization mode.

Another embodiment omits the initial learning-step 102 altogether. Therefore, as long as the learned function $f_{SVM}$ has not been learned by the supervised learning machine 70, the third estimator 68 uses a different algorithm for estimating the capacity. For example, it may use an RLS algorithm such as that described in Gregory L. Plett, "Recursive Approximate Weighted Total Least Squares Estimation of Battery Cell Total Capacity," Journal of Power Source, 196 (2011), 2319-2331. Some embodiments use a different Kalman filter in which the state model does not involve the learned function $f_{SVM}$. Among these are embodiments in which the state model is $C_{n,k3+1}=C_{n,k3}+w_{3,k3}$.

The battery 10 may be replaced by any type of battery, such as a lead battery, a super capacitor, or a fuel cell. In this case, the state model and/or the observation model of the first estimator 60 can optionally be adapted to take into account the battery technology.

What has been specified above also applies to the hybrid vehicle. As used herein, a "hybrid vehicle" is one in which either an electric motor or an internal combustion engine provide the energy. The vehicle 2 may also be a truck, a motorbike or a tricycle and generally speaking any vehicle capable of moving by driving of power wheels with the aid of an electric motor energized by a battery. In fact, it may be something like a hoist.

The battery 10 can be recharged with the aid of an electrical outlet that allows it to be electrically connected to the electricity mains. The battery 10 can also be recharged by a thermal internal combustion engine.

Finally, the method of estimation of the filter coefficients $h_{t,k2}$ as described above can be implemented independently of the supervised learning machine 70. Some examples omit the learned function $f_{SVM}$ from the second state-model 74. In this case, the third estimator 68 uses only the state model $C_{n,k3+1}=C_{n,k3}+w_{3,k3}$ and the supervised learning machine 70 is omitted. Neither is the third estimator 68 necessarily implemented in the form of a Kalman filter. Some embodiments estimate the capacity by simulating its variation over time in the form of an infinite impulse response filter whose coefficients are estimated by the recursive least square method. An even simpler embodiment avoids estimating the capacity $C_{n,k3}$ altogether. In such embodiments, the capacity is assumed to be constant and equal to the cell's initial capacity $C_n^{ini}$.

Having described the invention, and a preferred embodiment thereof, what is claimed as new, and secured by Letters Patent is:

1. A method comprising automatically estimating capacity of a cell of a battery,
   wherein k, k3, k3−1, and k3+1 are indices that identify discrete instants of time,
   wherein k identifies an instant in a first time series,
   wherein k3, k3−1, and k3+1 identify instants in a second time series,
   wherein the instant identified by k3−1 immediately precedes the instant represented by k3 and the instant represented by k3 immediately precedes the instant represented by k3+1,
   wherein, between any two instants of time, there exists a time interval between said two instants,
   wherein estimating said capacity of said cell comprises
   (I) acquiring, at k, a measured charging or discharging current ik of said cell,
   (II) executing an estimation step, wherein said estimation step comprises
      estimating a capacity $C_{n,k3}$ of said cell at k3 by using a Kalman filter, wherein estimating said capacity of said cell using said Kalman filter comprises
         calculating a prediction of said capacity $C_{n,k3}$ with the help of a state model that relates said capacity $C_{n,k3}$ to a capacity $C_{n,k3-1}$ of said cell at k3−1,
         acquiring, at k3, a measurable physical quantity $z_{k3}$ defined by:

$$z_{k3} = \sum_{m=k-N}^{m=k-1} i_m$$

wherein a time interval between k and k3 is less than the time interval between k3 and any other instant of time in the first time series,
         wherein N is an integer greater than or equal to one,
         wherein $z_{k3}$ is equal to $i_{k-1}$ when N is equal to one, and
         wherein $i_m$ is a measured charging or discharging current of said cell at an instant of time that is identified by the index m,
         calculating a prediction $\hat{z}_{k3}$ of said measurable physical quantity $z_{k3}$ with help from an observation model, and
         correcting said prediction of the capacity $C_{n,k3}$ as a function of a difference between said acquired physical quantity $z_{k3}$ and said prediction $\hat{z}_{k3}$ as calculated from said observation model,
   (III) automatically learning a function $G_{SVM}$ that returns said capacity $C_{n,k3}$ as a function of said capacity $C_{n,k3-1}$ and at least one physical characteristic $cc_{1,k3}$ correlated with change over time of said cell's capacity and measured at time k3, wherein automatically learning said function comprises
      executing a supervised learning algorithm on a learning database, said learning database having values of said capacity and, for each value of said capacity, a value of said physical characteristic measured concurrently with said capacity and a preceding value of said capacity, and
   (IV) once said function $G_{SVM}$ has been learned, during execution of said estimation step at k3+1, calculating a prediction of said capacity $C_{n,k3-1}$ using state model defined by $C_{n,k3+1}=G_{SVM}(C_{n,k3}, cc_{1,k3+1})$.

2. The method of claim 1,
   wherein said function $G_{SVM}(C_{n,k3-1}, cc_{1,k3})$ is defined by $G_{SVM}(C_{n,k3-1}, cc_{1,k3})=C_{n,k3-1}+f_{SVM}(cc_{1,k3})$ and
   wherein $f_{SVM}(cc_{1,k3})$ is a function learned during said learning step from data recorded in said learning database.

3. The method of claim 1 further comprising:
   at each k3, recording, in said learning database: said capacity $C_{n,k3}$ as predicted and then corrected by said Kalman filter during execution of said estimation step, and said physical characteristic $cc_{1,k3}$ measured at k3 and repeating the recording step for each remaining discrete time event in said second time series,
   wherein automatically learning said function $G_{SVM}$ comprises executing said supervised learning algorithm on said learning database in which said capacity $C_{n,k3}$ predicted and then corrected by said Kalman filter has been recorded.

4. The method of claim 3, wherein execution of said estimation step further comprises
   estimating a covariance $Pc_{k3}$ of an error associated with estimating said capacity $C_{n,k3}$ and
   triggering automatic learning of said function $G_{SVM}$ when said estimated covariance $Pc_{k3}$ crosses a predetermined threshold.

5. The method of claim 1, wherein calculating said $$\hat{z}_{k3} = \frac{(SOC_k - SOC_{k-N})}{NT_e} \cdot 3600 \cdot C_{n,k3}$$

prediction $\hat{z}_{k3}$ is done with help from an observation model defined by wherein $SOC_k$ and $SOC_{k-N}$ are the states of charge of the cell at k and k−N,
wherein $C_{n,k3}$ is, in said observation model, said prediction of the capacity of the cell at k3 calculated just before being corrected, and
wherein $T_e$ is a time interval that separates k and k−1.

6. The method of claim 1, wherein said supervised learning algorithm comprises a support vector machine.

7. The method of claim 1, further comprising calculating a state-of-health $SOH_{k3}$ of said cell based at least in part on a ratio of the capacity of said cell estimated at a most recent time and said cell's initial capacity.

8. A method comprising automatically estimating state-of-charge of a cell of said battery, wherein automatically estimating said state-of-charge comprises,
   at each instant defined by said first time series,
      acquiring a measured value of voltage between terminals of said cell and a measured charging or discharging current of said cell and executing an estimation step, wherein said estimation step comprises
(a) estimating a state-of-charge of said cell, from:
said measured value of voltage,
said measured current, and
a capacity of said cell, said capacity being indicative of a maximum quantity of electrical energy storable in said cell at an instant from said second time series, wherein said instant from said second time series is that instant that is closest to an instant from the first time series at which said capacity of said cell was estimated, and
(b) executing the method of claim 1 to estimate said capacity of said cell at each instant in said second time series, wherein successive instants in said first time series are separated by a first time interval, wherein successive instants in said second time series are separated by a second time interval, and wherein said second interval is greater than said first interval.

9. The method of claim 8, further comprising updating coefficients of an infinite impulse response filter $h_{t,k2+1}$, wherein updating said coefficients comprises
(i) calculating a prediction $Vp_{D,k}$ of a measured value of a voltage $V_{D,k}$ at terminals of an impedance of said cell, wherein said prediction is defined by $$V_{p_{D,k}} = h_{t,k2} * X_k = \sum_{i=0}^{i=Nh} b_{i,k2} * i_{k-i} - \sum_{i=1}^{i=Mh} \alpha_{i,k2} * V_{D,k-i}$$

wherein $i_{k-1}$ is current measured at an instant of time that is identified by k−i,
wherein $V_{D,k-i}$ is a voltage measured at terminals of said impedance of said cell at said instant of time that is identified by k−i,
wherein $a_{i,k2}$ and $b_{i,k2}$ are filter coefficients $h_{t,k2}$ updated at the instant of time identified by k2, wherein the instant of time identified by k2 is the instant of time that is closest to the instant of time identified by k, wherein Nh and Mh are constants, each of which is an integer that is greater than two,
(ii) calculating a difference $e_{RLS,k}$ between said measured value $V_{D,k}$ and said prediction $Vp_{D,k}$, wherein said measured value $V_{D,k}$ is obtained from a difference $y_k$−OCV($SOC_k$), wherein OCV($SOC_k$) is a predetermined function that returns a no-load voltage between said terminals of said cell for state-of-charge $SOC_k$ of said cell at k,
(iii) correcting said coefficients $a_{i,k2}$ and $b_{i,k2}$ to minimize said difference $e_{RLS,k}$, and
(iv) once said filter coefficients $h_{t,k2}$ have been updated and during execution of said estimation step, estimating state-of-charge $SOC_k$ of said cell with help from a Kalman filter that uses an observation model defined by $y_k$=OCV($SOC_k$)−$h_{t,k2}·X_k$, wherein $h_{t,k2}$ is a finite impulse response filter whose coefficients were updated at said instants of time identified by k2 closest to said instants of time identified by k, and wherein $X_k$ is the vector $[i_k, \ldots, i_{k-Nh}, V_{D,k-1}, \ldots, V_{D,k-Mh}]^T$.

10. The method of claim 9, further comprising selecting said Kalman filter used during execution of said estimation step to be a sigma point Kalman filter.

11. A manufacture comprising a tangible and non-transitory computer-readable medium having encoded thereon instructions that, when executed by a computer, cause said computer to perform the method of claim 1.

12. An apparatus comprising a battery management system outfitted with at least one cell, said battery-management system comprising an electronic computer programmed to perform the method recited in claim 1.

13. The apparatus of claim 12, further comprising an automobile, said automobile comprising
at least one powered wheel,
an electric motor configured to rotate said powered wheel to move said automobile,
a battery comprising at least one cell able to store electrical energy and, alternately, return the electrical energy in order to energize said electric motor, said cell comprising first and second terminals,
a voltmeter electrically connected between said first and second terminals to measure a voltage between said terminals, and
an ammeter connected in series with said cell to measure said charging or discharging current of said cell,
wherein said battery management system connects to said voltmeter and to said ammeter.

14. The method of claim 1, further comprising
providing a battery-management system that obtains, from an ammeter,
measurements of said charging or discharging current of said cell,
providing said Kalman filter for use in estimating said capacity,
providing said state model for use with said Kalman filter, and
providing a processor and memory for calculating said prediction and correcting said prediction and for automatically learning said function.

15. A method comprising automatically estimating capacity of a cell of a battery, wherein automatically estimating said capacity of said cell comprises,
(I) at a first time, acquiring a measured value of current associated with said cell, said current being one of a charging current and a discharging current,
(II) at a second time, using a Kalman filter to estimate a capacity of said cell at said second time, wherein using said Kalman filter to estimate said capacity comprises
using a state model, predicting said capacity of said cell at said second time, wherein said state model relates a capacity of said cell at a particular time to a capacity of said cell at a preceding time, said preceding time being a time preceding said particular time,
acquiring, at said second time, a measurable physical quantity, wherein said measurable physical quantity equals a summation of one or more currents, each of said one or more currents corresponding to one or more indices of summation, wherein said indices of summation extend from a lowest index to a highest index, wherein each index is greater than that which precedes it, wherein said lowest index is at least one less than a closest index, wherein said highest index is one less than said closest index, wherein said closest index corresponds to a time in a discrete time series that is closest to said second time, wherein, when said highest index and said lowest index are unequal, said summation of currents is equal to a sum of said currents identified by said indices of summation, and wherein, when said highest index and said lowest index are equal, said summation of currents is equal to a current at a time corresponding to said highest index, using an observation model, calculating a prediction of said measurable physical quantity, and correcting said prediction of said capacity at said second time as a function of a difference between said measurable physical quantity and said prediction of said measurable physical quantity as calculated from said observation model, (III) automatically learning a function that accepts first and second arguments and that, in response, returns a capacity at a particular time, said first argument being a capacity at a preceding time and said second argument being a physical characteristic whose value is correlated with changes in said capacity, said physical characteristic being measured at said particular time, wherein automatically learning said function comprises executing a supervised learning algorithm on a learning database, wherein, for each value of capacity, said learning database includes a value of said physical characteristic measured concurrently with said capacity and a value of a preceding capacity, and (IV) after having learned said function, while using said Kalman filter to estimate capacity at a third time that is later than said second time, calculating a prediction of said capacity at said third time using said state model that outputs a value of said capacity at said third time by providing, to said learned function, a value for said first argument and a value for said second argument, said value for said first argument being said capacity at said second time and said value for said second argument being said physical characteristic measured at said third time.

16. The method as claimed in claim 15, wherein the automatically learned function is defined by a sum of a first term and a second term, wherein said first term is equal to said capacity at said preceding time and said second term is a function of said physical characteristic measured at said particular time, said method further comprising carrying out a learning step for learning said second term using data recorded in said learning database.

\* \* \* \* \*